United States Patent
Chen et al.

(10) Patent No.: US 8,366,994 B2
(45) Date of Patent: Feb. 5, 2013

(54) METHOD FOR MANUFACTURING COBALT ALLOY-BASED CERAMIC COMPOSITE SPUTTERING TARGET

(75) Inventors: Rong-Zhi Chen, Kaohsiung (TW); Chun-Hao Chiu, Kaohsiung County (TW); Jui-Tung Chang, Tainan (TW); Deng-Far Hsu, Kaohsiung County (TW); Chih-Huang Lai, Hsinchu (TW)

(73) Assignee: China Steel Corporation, Kaohsiung (TW)

( * ) Notice: Subject to any disclaimer, the term of this patent is extended or adjusted under 35 U.S.C. 154(b) by 352 days.

(21) Appl. No.: 12/939,174

(22) Filed: Nov. 4, 2010

(65) Prior Publication Data
US 2011/0241253 A1 Oct. 6, 2011

(30) Foreign Application Priority Data
Mar. 30, 2010 (TW) .............................. 99109667 A

(51) Int. Cl.
*C22C 32/00* (2006.01)

(52) U.S. Cl. ................ 419/10; 419/19; 419/32; 419/38; 419/48; 419/49; 419/62; 204/298.13; 264/319; 264/299

(58) Field of Classification Search ................. 419/10
See application file for complete search history.

(56) References Cited

U.S. PATENT DOCUMENTS

| | | | | |
|---|---|---|---|---|
| 2007/0189916 A1* | 8/2007 | Zhang | ......................... | 419/66 |
| 2009/0053089 A1* | 2/2009 | Yang et al. | ..................... | 419/13 |
| 2009/0308740 A1* | 12/2009 | Kato et al. | ............... | 204/298.13 |
| 2009/0317280 A1* | 12/2009 | Chen et al. | ..................... | 419/62 |
| 2011/0003177 A1* | 1/2011 | Wu et al. | ..................... | 428/836.2 |

FOREIGN PATENT DOCUMENTS

JP 2006176810 A * 7/2006

* cited by examiner

*Primary Examiner* — Roy King
*Assistant Examiner* — Christopher Kessler
(74) *Attorney, Agent, or Firm* — CKC & Partners Co., Ltd.

(57) ABSTRACT

A method for manufacturing a cobalt (Co) alloy-based ceramic composite sputtering target is provided. A cobalt ingot and a chromium (Cr) ingot are melted in vacuum and then nebulized to form a cobalt-chromium (CoCr) alloy powder. Additionally, a ceramic powder and a platinum powder are wetly mixed to form a platinum-ceramic (Pt-ceramic) slurry, in which the ceramic powder is applied onto the platinum powder's surface uniformly. Next, the CoCr alloy powder and the Pt-ceramic slurry are wetly mixed to form a CoCrPt-ceramic slurry. Thereafter, the CoCrPt-ceramic slurry is dried, molded and compressed to form the cobalt alloy-based ceramic composite sputtering target. The resulted cobalt alloy-based ceramic composite sputtering target, which has a fine and dense structure, uniform composition and lower magnetic permeability, is beneficial to a magnetron sputter deposition process, as well as a film sputtering process used in the magnetic recording industry.

20 Claims, 3 Drawing Sheets

METHOD FOR MANUFACTURING COBALT ALLOY-BASED CERAMIC COMPOSITE SPUTTERING TARGET

RELATED APPLICATIONS

This application claims priority to Taiwan Application Serial Number 99109667, filed Mar. 30, 2010, which is herein incorporated by reference.

BACKGROUND

1. Field of Invention

The present invention relates to a method for manufacturing a sputtering target. More particularly, the present invention relates to method for manufacturing a metal ceramic composite sputtering target.

2. Description of Related Art

Due to continuous breakthroughs of the development and research on the process technology and related material of hard disk, the hard disk recently developed can be used for storing a tremendous amount of data. In general, data are stored on a thin-film magnetic recording layer, and the material forming the thin-film magnetic recording layer mainly is a cobalt (Co) alloy material containing precious metals (such as platinum (Pt)), for example, CoCrPt—$SiO_2$.

Using the preparation of a CoCrPt—$SiO_2$ sputtering target as an example for explanation, since its material contains $SiO_2$ ceramic, a powder metallurgy process has to be adopted for preparing the sputtering target. In brief, after a dry powder mixing process or wet powder mixing is used to fully mix a cobalt (Co) metal powder, a Chromium (Cr) metal powder and a $SiO_2$ powder, a molding and densification process is performed onto the mixed powders to form a CoCrPt—$SiO_2$ sputtering target. However, no matter which power mixing process is used, it is difficult to overcome the problem of failing to uniformly mixing the metal powers and the ceramic powder due to large specific weight differences between the metal powders and the ceramic powder.

In order to resolve the aforementioned problem, a conventional process ever presented a solution. Briefly speaking, in the conventional process, a Pt metal powder and a $SiO_2$ powder having a larger particle diameter are first processed by dry ball milling and then are calcined to form a Pt—$SiO_2$ powder. After a Co metal powder, a Cr metal powder and the Pt—$SiO_2$ powder undergo a dry powder mixing process, a molding and densification process is performed onto the powders thus mixed to form a CoCrPt—$SiO_2$ sputtering target. However, the CoCrPt—$SiO_2$ sputtering target formed by the conventional process has the disadvantage of coarse $SiO_2$ particles and still un-uniform distribution of metal and ceramic particles. When the sputtering target is applied on a subsequent thin-film sputtering process, after the sputtering target is ion bombarded by argon ions ($Ar^+$), the coarse ceramic phase of the sputtering target will cause heterogeneous particle defects occurring on the film sputtered.

In view of the foregoing, there is a need to provide a method for manufacturing a Co alloy-based ceramic composite sputtering target, thereby overcoming the problem of failing to uniformly mixing the metal powers and the ceramic powder due to large specific weight differences between the metal powders and the ceramic powder.

SUMMARY

Hence, an aspect of the present invention is to provide a method for manufacturing a Co alloy-based ceramic composite sputtering target, wherein a wet powder mixing process is used for allowing a ceramic powder to be embedded onto a surface of a platinum powder, and then a CoCr (cobalt-chromium) alloy powder and the Pt-ceramic slurry are uniformly mixed, thereby obtaining a Co alloy-based ceramic composite sputtering target having a fine and dense structure and uniform composition after drying, and molding and densification processes are performed. Thus, this method can effectively to overcome the problem of failing to uniformly mixing the metal powers and the ceramic powder due to large specific weight differences between the metal powders and the ceramic powder during the conventional process for fabricating a sputtering target.

Another aspect of the present invention is to a method for manufacturing a Co alloy-based ceramic composite sputtering target, wherein a nebulization process is used to nebulize a CoCr alloy solution into a CoCr alloy powder, thereby effectively lowering the magnetic permeability of the Co alloy-based ceramic composite sputtering target. Thus, the Co alloy-based ceramic composite sputtering target obtained from the above is beneficial to a magnetron sputter deposition process, and can be applied on a film sputtering process used in the magnetic recording industry.

According the above aspects of the present invention, a method for manufacturing a Co alloy-based ceramic composite sputtering target is provided. In one embodiment, a CoCr alloy powder is first provided, wherein by using a vacuum melting process and a nebulization process, a cobalt ingot and a chromium ingot are melted to form a CoCr alloy solution, and the CoCr alloy solution is nebulized into a CoCr alloy powder. Further, a wet powder mixing process is performed to allow the ceramic powder to be embedded onto a surface of a platinum powder in a solvent, thereby forming a platinum-ceramic (Pt-ceramic) slurry, wherein, for example, the platinum powder has a purity greater than 99.9%, and a hardness of the ceramic powder is greater than a hardness of the platinum powder, and a specific weight of the ceramic powder is smaller than a specific weight of the platinum powder. Thereafter, another wet powder mixing process is performed to uniformly mix the CoCr alloy powder and the Pt-ceramic slurry, thereby forming a CoCrPt-ceramic slurry. Then, a drying process is performed to dry the CoCrPt-ceramic slurry so as to form a CoCrPt-ceramic composite powder. Thereafter, a molding and densification process is performed to mold and densify the CoCrPt-ceramic composite powder so as to form the cobalt alloy-based ceramic composite sputtering target.

According to one embodiment, the aforementioned CoCrPt-ceramic composite powder may have, for example, the ceramic powder within a range from 9 percent by weight (wt %) to 25 wt %, the platinum powder within a range from 5 wt % to 25 t %, and the CoCr alloy powder within a range from 25 wt % to 75 wt %.

According to one embodiment, the aforementioned solvent can be such as water, alcohol or combinations thereof.

According to one embodiment, after the aforementioned nebulization process is performed, a cooling process can be optionally performed to cool down the CoCr alloy powder nebulized.

According to one embodiment, the aforementioned drying process can be such as a vacuum drying process or an atmospheric drying process.

According to one embodiment, the aforementioned molding and densification process can be such as a hot pressing (HP) process or a hot isostatic pressing (HIP) process.

According to one embodiment, the cobalt alloy-based ceramic composite sputtering target obtained from the above can be applied on a film sputtering process used in a magnetic recording medium.

With the application of the method of the present invention for manufacturing the Co alloy-based ceramic composite sputtering target, the wet powder mixing process is used to allow the ceramic powder to be uniformly embedded onto the surface of the platinum powder, and the nebulization process is used to nebulize the CoCr alloy solution into the CoCr alloy powder, and the CoCr alloy powder and the Pt-ceramic slurry are uniformly mixed, thereby forming the Co alloy-based ceramic composite sputtering target after the drying, molding and densification processes are performed. Therefore, the Co alloy-based ceramic composite sputtering target obtained has a fine and dense structure, uniform composition and low magnetic permeability, which is not only beneficial to a magnetron sputter deposition process, but also is applicable to a film sputtering process used in the magnetic recording industry.

It is to be understood that both the foregoing general description and the following detailed description are examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Figure 1:
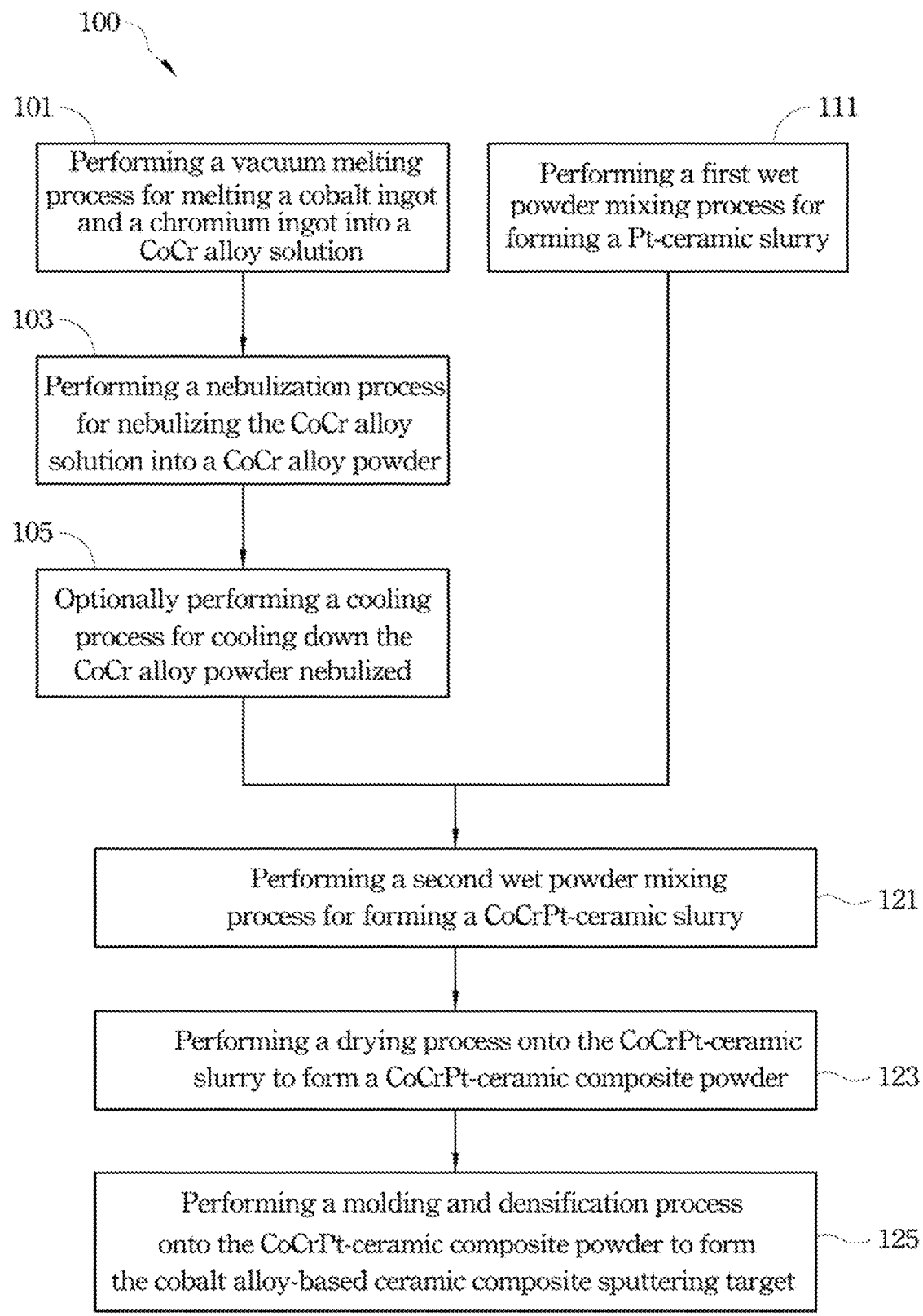
FIG. 1 is a partial schematic flow chart showing a method for manufacturing a Co alloy-based ceramic composite sputtering target according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Continued from the above description, the present invention provides a method for manufacturing a Co alloy-based ceramic composite sputtering target, wherein a wet powder mixing process is used for allowing a ceramic powder to be embedded onto a surface of a platinum powder, and a nebulization process is used to nebulize a CoCr alloy solution into a CoCr alloy powder, and thereafter a CoCr alloy powder and the Pt-ceramic slurry are uniformly mixed, thereby obtaining a Co alloy-based ceramic composite sputtering target after drying, and molding and densification processes are performed.

The "Co alloy-based ceramic composite sputtering target" is referred herein as a sputtering target formed from CoCrPt-ceramic composite material which has a fine and dense structure, uniform composition and low magnetic permeability. In one embodiment, the aforementioned Co alloy-based ceramic composite sputtering target can be formed by using a method 100 shown in FIG. 1. Referring to FIG. 1, FIG. 1 is a partial schematic flow chart showing a method for manufacturing a Co alloy-based ceramic composite sputtering target according to one embodiment of the present invention. In one embodiment, the method 100 is first to provide a CoCr alloy powder by performing a vacuum melting process (step 101) and a nebulization process (step 103), wherein a cobalt ingot and a chromium ingot are melted into a CoCr alloy solution (step 101), and then the CoCr alloy solution is nebulized into a CoCr alloy powder (step 103). In one example, the aforementioned vacuum melting process (step 101) can be performed in a vacuum inductive melting (VIM) furnace. In another example, the vacuum melting process can be performed at a temperature between 1650° C. and 1750° C. and a vacuum level less than $10^{-3}$ torr. In another example, the nebulization process (step 103) utilizes high-pressure gas to spray on and nebulize the CoCr alloy solution, wherein the high-pressure gas can be argon or nitrogen and is sprayed on and nebulize the CoCr alloy solution at a pressure between 20 atm (atmosphere) and 30 atm, thereby enabling the CoCr alloy powder nebulized to have an average particle diameter ranged between 10 μm and 40 μm.

In this embodiment, after the aforementioned CoCr alloy powder is provided, a cooling step (process) can be optionally performed, wherein the cooling process can be a nature cooling process or another cooling method for cooling down the CoCr alloy powder nebulized, as shown in step 105. In one example, the cooling process may use the high-pressure gas used in the aforementioned nebulization process to continuously spray on the CoCr alloy powder nebulized, thereby accelerating its cooling rate.

In one embodiment, a first wet powder mixing process can further be performed for allowing the ceramic powder to be uniformly embedded onto a surface of a platinum powder in a solvent, thereby forming a Pt-ceramic slurry, as shown in step 111, wherein the solvent can be such as water, alcohol or combinations thereof. In one example, the first wet powder mixing process may last for 1 hour to 2 hours so as to allow the ceramic powder to be uniformly embedded onto the surface of the platinum powder. However, it needs to be noted that the wet powder mixing process will not be described in detail herein since it can use any conventional powder-mixing equipment and process conditions which are well known to those who are skilled in the art.

In one example, the purity of the platinum powder is greater than about 99.9%, and the hardness of the ceramic powder is greater than that of the platinum powder, and a specific weight of the ceramic powder is smaller than that of the platinum powder. In another example, the purity of the platinum powder is greater than about 99.95%, and the ceramic powder is formed from $SiO_2$, $TiO_2$, $CoO$, $Cr_2O_3$, $Ta_2O_5$ or combinations thereof. In another example, the average particle diameter of the ceramic powder is ranged between about 0.07 μm and about 1.0 μm.

In on embodiment, after the process of providing the CoCr alloy powder and the first wet powder mixing process are performed, a second wet powder mixing process can be performed for uniformly mixing the CoCr alloy powder and the Pt-ceramic slurry, thereby forming a CoCrPt-ceramic slurry, as shown in step 121. In one example, the second wet powder mixing process may use the same or similar powder-mixing equipment and process conditions of the first wet powder mixing process, but lasts longer than the first wet powder mixing process does, such as for 12 hour to 18 hours.

In one embodiment, after the wet powder mixing processes, a drying process can be performed to dry the CoCrPt-ceramic slurry to form a CoCrPt-ceramic composite powder, as shown in step 123. In one example, the drying process can be a vacuum drying process or an atmospheric drying process. In another example, the vacuum drying process can be performed at a temperature between about 80° C. and about 120° C. and a vacuum level less is than about 760 torr for about 2 hours to about 4 hours. In another example, the atmospheric drying process is performed at a temperature between about 100° C. and about 160° C. for about 4 hours to about 6 hours.

In one embodiment, after the drying process, a molding and densification process can be performed to press and dry the CoCrPt-ceramic composite powder, so as to form the cobalt alloy-based ceramic composite sputtering target, as shown in step 125. In one example, the molding and densification process can be a hot pressing (HP) process or a hot isostatic pressing (HIP) process. In another example, the molding and densification process can be performed at a temperature between 900° C. and 1200° C. for 1 hour to 4 hours.

It is worthy to be noted that the aforementioned steps may be performed in a batch process or an automatic continuous process in accordance with actual needs. The Co alloy-based ceramic composite sputtering target obtained via the aforementioned steps has a fine and dense structure, uniform composition and low magnetic permeability, which is not only beneficial to a magnetron sputter deposition process, but also is applicable to a film sputtering process used in the magnetic recording industry.

The following embodiments are used for explain the applications of the present invention, but do not intend to limit the present invention. Those skilled in the art may make various modifications and variations without departing from the scope or spirit of the invention.

Embodiment 1

Preparation and Evaluation of a CoCrPt—$SiO_2$—$Ta_2O_5$ Sputtering Target (1)

In this embodiment, at first, surfaces of a cobalt ingot and a Cr ingot are cleaned. Concretely speaking, the cobalt ingot and the chromium ingot can be placed in a hydrochloric acid solution of 95 percent by volume (vol. %) or above, and for example, ultrasonic vibration is applied to remove oxides and greasiness located on the surfaces of the cobalt and chromium ingots. Thereafter, the cobalt ingot and the chromium ingot are placed in de-ionized water (DIW), and for example, ultrasonic vibration is applied to remove the hydrochloric acid solution residue remaining on the surfaces of the cobalt and chromium ingots. Then, the cobalt ingot and the chromium ingot are dried by drying in the shade, baking or other methods.

Thereafter, a vacuum melting process is performed to melt the cobalt ingot and the chromium ingot which have been process by the above steps, wherein the contents of the cobalt ingot and the chromium ingot are 41 wt. % and 7 wt. % respectively. After the cobalt ingot and the chromium ingot are placed in a crucible of a VIM furnace, the vacuum in the VIM furnace starts being pulled. When the vacuum level is reached or below $10^{-3}$ torr, the temperature in the VIM furnace starts being raised to about 1750° C. After the cobalt ingot and the chromium ingot in the crucible are fully melted, such temperature is maintained for about 3 minutes so as to ensure that the cobalt ingot and the chromium ingot are totally melted into a CoCr alloy solution, and meanwhile, the respective contents of the melted CoCr alloy solution can be mixed more uniformly under the influence of magnetic stirring provided by the inductive coils of the VIM furnace.

Thereafter, the melted and uniformly mixed CoCr alloy solution is poured out from the crucible, and undergoes a nebulization process, wherein high pressure argon of about 28 atm is used to spray on the CoCr alloy solution for nebulizing the CoCr alloy solution into a CoCr alloy powder. The nebulized CoCr alloy powder can be placed in a chamber of the VIM furnace, and for example, nitrogen can be optionally used to continuously spray on the CoCr alloy powder, thereby performing a cooling step (process) to accelerate the cooling of the nebulized CoCr alloy powder.

Then, a first wet powder mixing process is performed for about 2 hours so as to allow a ceramic powder containing $SiO_2$ (its average particle diameter is 0.25 μm) and $Ta_2O_5$ (its average particle diameter is 0.70 μm) to be uniformly embedded onto a surface of a platinum powder (its average particle diameter is 0.3 μm) in water, thereby forming a Pt-ceramic slurry, wherein the purity of the platinum powder is greater than 99.9%, and the contents of the $SiO_2$, $Ta_2O_5$ and the platinum powder are about 3 wt. %, about 19 wt. % and about 30 wt. % respectively, and the hardness of the ceramic powder is greater than that of the platinum powder, and the specific weight of the ceramic powder is smaller than that of the platinum powder.

Thereafter, a second wet powder mixing process is performed for about 18 hours so as to uniformly mix the CoCr alloy powder and the Pt-ceramic slurry obtained from the above steps into a CoCrPt—$SiO_2$—$Ta_2O_5$ slurry. Then, a drying process is performed, wherein the CoCrPt—$SiO_2$—$Ta_2O_5$ slurry is placed in a commercial atmospheric oven for performing an atmospheric drying process at a temperature of about 160° C. for about 6 hours, thereby making the CoCrPt—$SiO_2$—$Ta_2O_5$ slurry as a CoCrPt—$SiO_2$—$Ta_2O_5$ powder. Thereafter, the dried CoCrPt—$SiO_2$—$Ta_2O_5$ powder is placed into a graphite mold and a HP process is used for performing a molding and densification process at a temperature of about 1150° C. for about 4 hours, wherein the CoCrPt—$SiO_2$—$Ta_2O_5$ powder is pressed into a predetermined target shape, and then is densified via an annealing process, thereby obtaining a CoCrPt—$SiO_2$—$Ta_2O_5$ sputtering target. The CoCrPt—$SiO_2$—$Ta_2O_5$ sputtering target includes 41 wt % Co, 7 wt % Cr, 30 wt % Pt, 3 wt % $SiO_2$ and 19 wt % $Ta_2O_5$.

Figure 2:
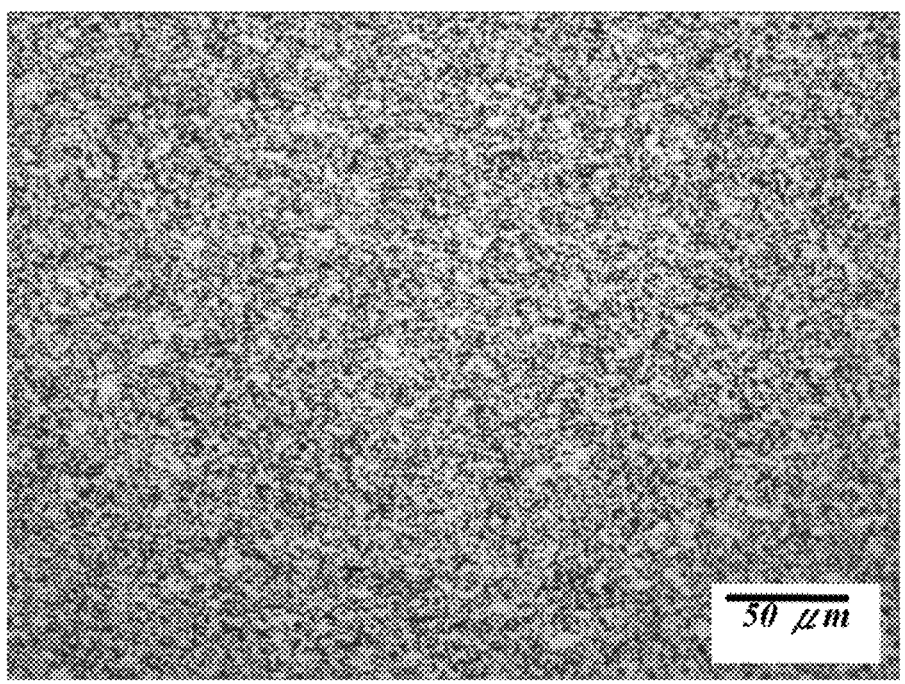
FIG. 2 is a SEM (Scanning Electron Microscopy) photo (magnification: 200) showing a CoCrPt—$SiO_2$—$Ta_2O_5$ sputtering target according to one embodiment of the present invention.

After the obtained CoCrPt—$SiO_2$—$Ta_2O_5$ sputtering target is scanned by a SEM, the result is shown in FIG. 2. Referring to FIG. 2, FIG. 2 is a SEM photo (magnification: 200) showing a CoCrPt—$SiO_2$—$Ta_2O_5$ sputtering target according to one embodiment of the present invention. It can be known from FIG. 2 that, in the CoCrPt—$SiO_2$—$Ta_2O_5$ sputtering target obtained, the structure is fine and dense, and the distributions of the metals and ceramic are quite uniform, and thus the magnetic permeability of the target can be effectively lowered.

Embodiment 2

Preparation and Evaluation of a CoCrPt—$SiO_2$—$TiO_2$ Sputtering Target (2)

In this embodiment, at first, surfaces of a cobalt ingot and a Cr ingot are cleaned. Concretely speaking, the cobalt ingot and the chromium ingot can be placed in a hydrochloric acid solution of 95 vol. % or above, and for example, ultrasonic vibration is applied to remove oxides and greasiness located on the surfaces of the cobalt and chromium ingots. Thereafter, the cobalt ingot and the chromium ingot are placed in de-ionized water (DIW), and for example, ultrasonic vibration is applied to remove the hydrochloric acid solution residue remaining on the surfaces of the cobalt and chromium ingots. Then, the cobalt ingot and the chromium ingot are dried by drying in the shade, baking or other methods.

Thereafter, a vacuum melting process is performed to melt the cobalt ingot and the chromium ingot which have been process by the above steps, wherein the contents of the cobalt ingot and the chromium ingot are 48 wt. % and 8 wt. % respectively. After the cobalt ingot and the chromium ingot are placed in a crucible of a VIM furnace, the vacuum in the VIM furnace starts being pulled. When the vacuum level is reached or below $10^{-3}$ torr, the temperature in the VIM furnace starts being raised to about 1650° C. After the cobalt ingot and the chromium ingot in the crucible are fully melted, such temperature is maintained for about 10 minutes so as to ensure that the cobalt ingot and the chromium ingot are totally melted into a CoCr alloy solution, and meanwhile, the respective contents of the melted CoCr alloy solution can be mixed more uniformly under the influence of magnetic stirring provided by the inductive coils of the VIM furnace.

Thereafter, the melted and uniformly mixed CoCr alloy solution is poured out from the crucible, and undergoes a nebulization process, wherein high pressure nitrogen of about 20 atm is used to spray on the CoCr alloy solution for nebulizing the CoCr alloy solution into a CoCr alloy powder. The nebulized CoCr alloy powder can be placed in a chamber of the VIM furnace, and a nature cooling step (process) is optionally performed to cool down the nebulized CoCr alloy powder.

Then, a first wet powder mixing process is performed for about 1 hour so as to allow a ceramic powder containing $SiO_2$ (its average particle diameter is 0.25 μm) and $Ta_2O_5$ (its average particle diameter is 0.70 μm) to be embedded onto a surface of a platinum powder (its average particle diameter is 0.3 μm) in water, thereby forming a Pt-ceramic slurry, wherein the purity of the platinum powder is greater than 99.95%, and the contents of the $SiO_2$, $TiO_2$ and the platinum powder are about 3 wt. %, about 4 wt. % and about 37 wt. % respectively, and the hardness of the ceramic powder is greater than that of the platinum powder, and the specific weight of the ceramic powder is smaller than that of the platinum powder.

Thereafter, a second wet powder mixing process is performed for about 12 hours so as to uniformly mix the CoCr alloy powder and the Pt-ceramic slurry obtained from the above steps into a CoCrPt—$SiO_2$—$TiO_2$ slurry. Then, a drying process is performed, wherein the CoCrPt—$SiO_2$—$TiO_2$ slurry is placed in a commercial vacuum oven for performing a vacuum drying process at a vacuum level of 76 torr and a temperature of about 80° C. for about 2 hours, thereby making the CoCrPt—$SiO_2$—$TiO_2$ slurry as a CoCrPt—$SiO_2$—$TiO_2$ powder. Thereafter, the dried CoCrPt—$SiO_2$—$TiO_2$ powder is placed into a stainless steel canning container and a HIP process is used for performing a molding and densification process at a temperature of about 1000° C. for about 2 hours, wherein the CoCrPt—$SiO_2$—$TiO_2$ powder is pressed into a predetermined target shape, and then is densified via an annealing process, thereby obtaining a CoCrPt—$SiO_2$—$TiO_2$ sputtering target. The CoCrPt—$SiO_2$—$TiO_2$ sputtering target includes 48 wt % Co, 8 wt % Cr, 37 wt % Pt, 3 wt % $SiO_2$ and 4 wt % $TiO_2$.

Figure 3:
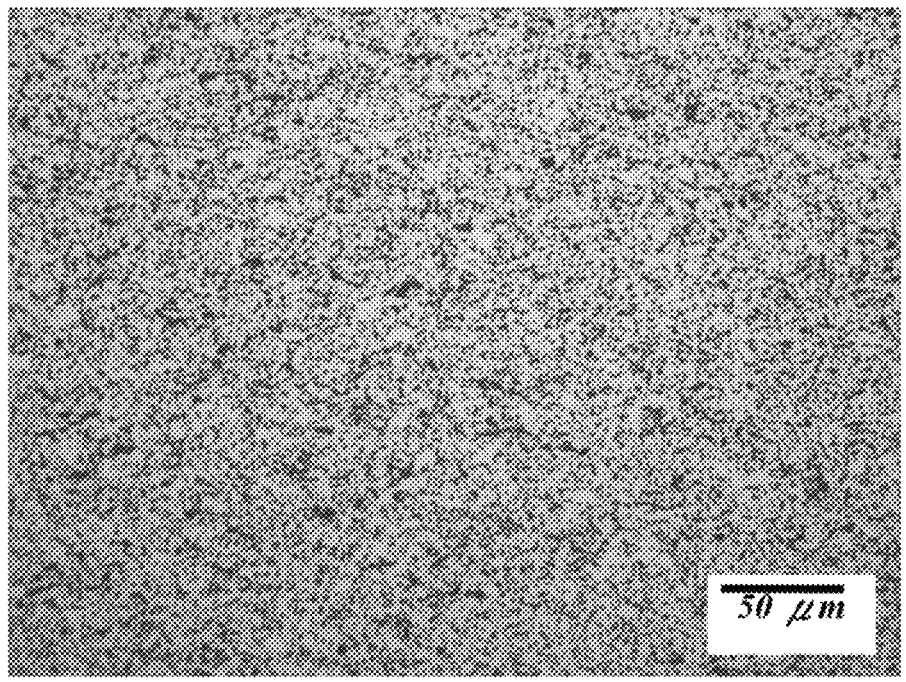
FIG. 3 is a SEM photo (magnification: 200) showing a CoCrPt—$SiO_2$—$TiO_2$ sputtering target according to another embodiment of the present invention.

After the obtained CoCrPt—$SiO_2$—$TiO_2$ sputtering target is scanned by a SEM, the result is shown in FIG. 3. Referring to FIG. 3, FIG. 3 is a SEM photo (magnification: 200) showing a CoCrPt—$SiO_2$—$TiO_2$ sputtering target according to another embodiment of the present invention. It can be known from FIG. 3 that, in the CoCrPt—$SiO_2$—$TiO_2$ sputtering target obtained, the structure is fine and dense, and the distributions of the metals and ceramic are quite uniform, and thus the magnetic permeability of the target can be effectively lowered.

Comparative Example

Preparation and Evaluation of a Co Alloy-Based Ceramic Composite Sputtering Target (2)

In this comparative example, at first, a dry powder mixing step is performed to directly mix a Co metal powder, a Cr metal powder, a Pt metal powder and a $SiO_2$ powder, and then the aforementioned HP or HIP process us used to perform a molding and densification process to press the CoCrPt—$SiO_2$ powder into a predetermined target shape and then is densified via an annealing process, thereby obtaining a CoCrPt—$SiO_2$ sputtering target. The CoCrPt—$SiO_2$ sputtering target includes 50 wt % Co, 7 wt % Cr, 35 wt % Pt and 8 wt % $SiO_2$.

Figure 4:
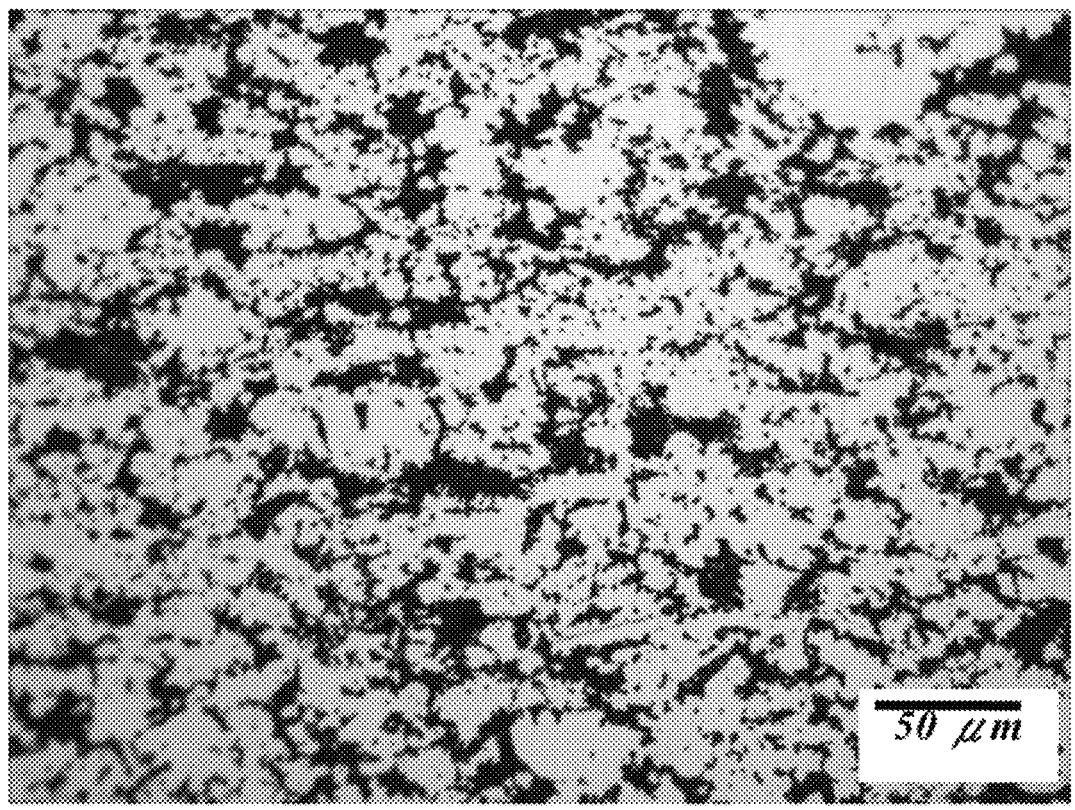
FIG. 4 is a SEM photo (magnification: 200) showing a conventional CoCrPt—$SiO_2$ sputtering target.

After the obtained CoCrPt—$SiO_2$ sputtering target is scanned by a SEM, the result is shown in FIG. 4. Referring to FIG. 4, FIG. 4 is a SEM photo (magnification: 200) showing a conventional CoCrPt—$SiO_2$ sputtering target. It can be known from FIG. 4 that, in the CoCrPt—$SiO_2$ sputtering target obtained, the particles are coarse, and the distributions of the metals and ceramic are not uniform. Thus, when a thin-film sputtering process is performed, after the sputtering target is ion bombarded by argon ions ($Ar^+$), the coarse ceramic phase of the sputtering target causes heterogeneous particle defects occurring on the film sputtered, thus resulting in disk failure and further lowering production yield of disks.

Further, it is noted that, although the present invention uses specific magnetic materials, precious metals, ceramic materials, solvents, gases, reaction conditions or equipment as examples for explaining a method for manufacturing a Co alloy-based ceramic composite sputtering target, yet those skilled in the art may be aware that, without departing from the scope or spirit of the invention, other magnetic materials, precious metals, ceramic materials, solvents, gases, reaction conditions or equipment also are applicable to the present invention, so that the present invention is not limited thereto.

It can be known from the aforementioned embodiments that, the method of the present invention for manufacturing the Co alloy-based ceramic composite sputtering target has the advantages of using the wet powder mixing process to allow the ceramic powder to be uniformly embedded onto the surface of the platinum powder; using the nebulization process to nebulize the CoCr alloy solution into the CoCr alloy powder; and then uniformly mixing the CoCr alloy powder and the Pt-ceramic slurry, thereby forming the Co alloy-based ceramic composite sputtering target via the drying, molding and densification processes. Therefore, the Co alloy-based ceramic composite sputtering target obtained has a fine and dense structure, uniform composition and low magnetic permeability, which is not only beneficial to a magnetron sputter deposition process, but also is applicable to a film sputtering process used in the magnetic recording industry.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a cobalt (Co) alloy-based ceramic composite sputtering target, comprising:
   providing a cobalt-chromium (CoCr) alloy powder, comprising:
      performing a vacuum melting process for melting a cobalt ingot and a chromium ingot into a CoCr alloy solution; and
      performing a nebulization process for nebulizing the CoCr alloy solution into a CoCr alloy powder;
   performing a first wet powder mixing process for allowing a ceramic powder to be uniformly embedded onto a surface of a platinum powder in a solvent, thereby forming a platinum-ceramic (Pt-ceramic) slurry, wherein a purity of the platinum powder is greater than 99.9%, and a hardness of the ceramic powder is greater than a hardness of the platinum powder, and a specific weight of the ceramic powder is smaller than a specific weight of the platinum powder;
   performing a second wet powder mixing process for uniformly mixing the CoCr alloy powder and the Pt-ceramic slurry, thereby forming a CoCrPt-ceramic slurry;
   performing a drying process onto the CoCrPt-ceramic slurry to form a CoCrPt-ceramic composite powder; and
   performing a molding and densification process onto the CoCrPt-ceramic composite powder to form the cobalt alloy-based ceramic composite sputtering target.

2. The method as claimed in claim 1, wherein the vacuum melting process is performed in a vacuum inductive melting (VIM) furnace.

3. The method as claimed in claim 1, wherein the vacuum melting process is performed at a temperature between 1650° C. and 1750° C. and a vacuum level of $10^{-3}$ torr.

4. The method as claimed in claim 1, wherein the nebulization process utilizes high-pressure gas to spray on and nebulize the CoCr alloy solution.

5. The method as claimed in claim 4, wherein the high-pressure gas is argon or nitrogen and is sprayed on and nebulize the CoCr alloy solution at a pressure between 20 atm (atmosphere) and 30 atm.

6. The method as claimed in claim 1, wherein an average particle diameter of the CoCr alloy powder is ranged between 10 μm and 40 μm.

7. The method as claimed in claim 1, wherein, after the nebulization process, the method further comprises:
   performing a cooling process for cooling down the CoCr alloy powder nebulized.

8. The method as claimed in claim 7, wherein the cooling process is a natural cooling process or a cooling process using high-pressure gas for cooling the CoCr alloy powder, and the high-pressure gas is argon or nitrogen and is sprayed on the CoCr alloy powder at a pressure between 20 atm and 30 atm.

9. The method as claimed in claim 1, wherein the CoCrPt-ceramic composite powder has the ceramic powder within a range from 9 percent by weight (wt %) to 25 wt %, the platinum powder within a range from 5 wt % to 25 wt %, and the CoCr alloy powder within a range from 25 wt % to 75 wt %.

10. The method as claimed in claim 1, wherein the ceramic powder is formed from a material selected from the group consisting of $SiO_2$, $TiO_2$, $CoO$, $Cr_2O_3$, $Ta_2O_5$ and combinations thereof.

11. The method as claimed in claim 1, wherein an average particle of diameter the ceramic powder is ranged between 0.07 μm and 1.0 μm.

12. The method as claimed in claim 1, wherein the solvent is formed from a material selected from the group consisting of water, alcohol and combinations thereof.

13. The method as claimed in claim 1, wherein the first wet powder mixing process lasts for 1 hour to 2 hours.

14. The method as claimed in claim 1, wherein the second wet powder mixing process lasts for 12 hour to 18 hours.

15. The method as claimed in claim 1, wherein the drying process is a vacuum drying process or an atmospheric drying process.

16. The method as claimed in claim 15, wherein the vacuum drying process is performed at a temperature between 80° C. and 120° C. and a vacuum level less than 760 torr for 2 hours to 4 hours.

17. The method as claimed in claim 15, wherein the atmospheric drying process is performed at a temperature between 100° C. and 160° C. for 4 hours to 6 hours.

18. The method as claimed in claim 1, wherein the molding and densification process is a hot pressing (HP) process or a hot isostatic pressing (HIP) process.

19. The method as claimed in claim 1, wherein the molding and densification process is performed at a temperature between 900° C. and 1200° C., for 1 hour to 4 hours.

20. The method as claimed in claim 1, wherein the cobalt alloy-based ceramic composite sputtering target is applied on a film sputtering process used in a magnetic recording medium.

* * * * *